(12) United States Patent
Chae

(10) Patent No.: US 7,231,569 B2
(45) Date of Patent: Jun. 12, 2007

(54) SCAN FLIP-FLOP CIRCUIT WITH REDUCED POWER CONSUMPTION

(75) Inventor: Kwan-Yeob Chae, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 288 days.

(21) Appl. No.: 11/068,908

(22) Filed: Mar. 2, 2005

(65) Prior Publication Data

US 2005/0283691 A1  Dec. 22, 2005

(30) Foreign Application Priority Data

Jun. 18, 2004  (KR) ............ 10-2004-0045607

(51) Int. Cl.
  *G01R 31/28* (2006.01)
(52) U.S. Cl. ................. 714/727; 714/729
(58) Field of Classification Search ........ 714/731, 714/733, 726, 727, 729; 327/211, 202; 326/93, 326/16, 46

See application file for complete search history.

(56) References Cited

U.S. PATENT DOCUMENTS

| | | | |
|---|---|---|---|
| 5,500,861 A * | 3/1996 | Oppedahl | 714/731 |
| 5,938,782 A * | 8/1999 | Kay | 714/726 |
| 6,023,179 A * | 2/2000 | Klass | 327/211 |
| 6,114,892 A | 9/2000 | Jin | |
| 6,182,256 B1 * | 1/2001 | Qureshi | 714/726 |
| 6,380,780 B1 * | 4/2002 | Aitken et al. | 327/202 |
| 6,456,113 B2 * | 9/2002 | Kanba | 326/93 |
| 6,622,273 B1 * | 9/2003 | Barnes | 714/733 |
| 6,680,622 B2 * | 1/2004 | Zounes | 326/16 |
| 6,794,898 B2 * | 9/2004 | Komaki | 326/46 |

FOREIGN PATENT DOCUMENTS

| | | |
|---|---|---|
| JP | 2001-305180 | 10/2001 |
| JP | 2002-311092 | 10/2002 |

* cited by examiner

*Primary Examiner*—David Ton
(74) *Attorney, Agent, or Firm*—Volentine & Whitt, PLLC

(57) ABSTRACT

A scan flip-flop circuit and related scan chain are disclosed. The scan flip flop comprises in one embodiment an input stage receiving, selecting between, and outputting either a normal logic signal or a scan logic signal in accordance with an operation mode for the scan flip-flop circuit. The scan flip-flop further comprises a flip-flop receiving either the normal logic signal or the scan logic signal selected by the input stage, and outputting in accordance with a clock signal a first logic signal from a first flip-flop output terminal and an output stage receiving the first logic signal and comprising first and second output terminals, such that a signal output from the first output terminal is identical to the normal logic signal received in the input stage, and a signal output from the second output terminal maintains a high logic value when the scan flip-flop circuit operates in a normal mode and a signal output from the first and second output terminals are identical to the scan logic signal received in the input stage when the scan flip-flop circuit operates in a scan mode.

13 Claims, 5 Drawing Sheets

SCAN FLIP-FLOP CIRCUIT WITH REDUCED POWER CONSUMPTION

BACKGROUND OF THE INVENTION

The present invention relates to a scan circuit for testing a semiconductor integrated circuit (hereinafter referred to as an "IC"), such as a microcontroller unit (hereinafter referred to as a "MCU"). More particularly, the present invention relates to a scan flip-flop circuit having reduced power consumption during a normal operating mode.

A claim of priority is made under 35 U.S.C. § 119 to Korean Patent Application 2004-45607 filed on Jun. 18, 2004, the entire contents of which are hereby incorporated by reference.

In a semiconductor IC such as a MCU, a competent scan test function is essential to a determination of whether respective logic gates within the MCU operate properly. As the number of logic gates used in contemporary MCU designs has increased, the relative importance of the scan test function has also increased.

A particular type of test circuit is routinely used to implement the scan test function. Generally speaking, this test circuit includes hardware capable of storing test data adapted to establish a defined internal state for the logic gates being tested. Output data is collected in response to the test data. The output data indicates whether the logic gates are operating normally or in error. This generic type of test circuit is termed a "scan flip-flop circuit".

FIG. 1 is a circuit diagram showing a conventional scan flip-flop circuit 100. Referring to FIG. 1, the conventional scan flip-flop circuit 100 includes an input stage 116, a D flip-flop 110, and an output stage 118. The scan flip-flop circuit 100 has four input terminals D, TI, TE, and CK, and two output terminals Q and QN. The input terminal includes a mode input terminal TE, a normal input terminal D, a scan input terminal TI, and a clock input terminal CK. An operating mode signal is applied to mode input terminal TE, a normal logic signal is applied to normal input terminal D, a scan logic signal is applied to scan input terminal TI, and a clock signal is applied to clock input terminal CK. The first output terminal Q receives one of the normal logic signal or the scan logic signal which are applied to the normal input terminal D and the scan input terminal TI, respectively. The first output terminal Q produces an output in accordance with the clock signal. The second output terminal QN similarly receives either the normal logic signal or the scan logic signal, inverts the received signal, and outputs the result in accordance with the clock signal.

Input stage 116 of scan flip-flop circuit 100 selects between the normal logic signal and the scan logic signal in accordance with a defined operating mode for the scan flip-flop circuit 100, and outputs the selected logic signal to the D flip-flop 110. Input stage 116 includes a first AND gate 104, a second AND gate 106, and a NOR gate 108. First AND gate 104 ANDs the normal logic signal and an inverted operating mode signal. Second AND gate 106 ANDs the scan logic signal and an operating mode signal. NOR gate 108 NORs an output of first AND gate 104 and an output of second AND gate 106. Accordingly, input stage 116 selects and outputs the normal logic signal when scan flip-flop circuit 100 operates in a normal mode (TE='0'), and selects and outputs the scan logic signal when scan flip-flop circuit 100 operates in a scan mode (TE='1').

Unfortunately, the input stage of the conventional scan flip-flop circuit is characterized by a large number of transistors which are necessary to implement the plurality of logic gates. Because of this large number of transistors, the conventional scan flip-flop circuit occupies a considerable space within the semiconductor IC and generally reduces the overall degree of device integration.

Returning to FIG. 1, D flip-flop 110 includes one input terminal which receives either the normal logic signal or the scan logic signal from input stage 116 and outputs the received logic signal in synchronism with the clock signal. Typically, D flip-flop 110 of scan flip-flop circuit 100 is triggered on a rising edge of the clock signal. Operation and construction of the D flip-flop is conventional. In a case where a rising clock edge is applied to a clock (or gating) terminal of D flip-flop 110, the D flip-flop will output a signal having a logic value of '1' when the received input signal has a logic value of '1', and will output a signal having a logic value of '0' when the received input signal has a logic value of '0'. D flip-flip 110 also delays its output relative to the received input signal by a time interval up to the period of the clock signal.

Output stage 118 includes first and second inverters 112 and 114, which are respectively connected to output terminals Q and QN of D flip-flop 110. First and second inverters, 112 and 114, respectively invert signals to be output from first and second output terminals Q and QN of D flip-flop 110.

Table 1 is a truth table showing values output from output terminals Q and QN and corresponding values applied to the respective input terminals D, TI, TE, and CK in the conventional scan flip-flop circuit shown in FIG. 1. Here, Q(n+1) indicates an output corresponding to an $(n+1)^{th}$ clock signal.

TABLE 1

| D | T1 | TE | CK | Q(n + 1) | QN(n + 1) |
|---|----|----|----|----------|-----------|
| 0 | x  | 0  | Rising  | 0 | 1 |
| 1 | x  | 0  | Rising  | 1 | 0 |
| x | 0  | 1  | Rising  | 0 | 1 |
| x | 1  | 1  | Rising  | 1 | 0 |
| x | x  | x  | Falling | Q(n) | QN(n) |

FIG. 2 is a circuit diagram illustrating an example of a scan chain circuit and its operation using a plurality of scan flip-flop circuits like the one shown in FIG. 1. As shown in FIG. 2, the scan chain is composed of five scan flip-flip circuits 202, 204, 206, 208, and 210, and two combinational logic circuits 212 and 214. It is assumed that three scan flip-flip circuits 202, 204, and 206 each respectively receive externally applied normal logic signals when a scan chain operates at a normal mode. It is further assumed that each of the combinational logic circuits 212 and 214 includes at least one output terminal and at least two input terminals. Logic states for signals apparent at the respective output terminals of the combinational logic circuits 212 and 214 are determined by the respective states of signals simultaneously applied to the corresponding input terminals.

The scan chain includes three normal input terminals IN1, IN2, and IN3, one scan input terminal SCAN_IN, a mode input terminal TEST, a clock input terminal CLK, and one output terminal OUT or SCAN_OUT. An externally derived normal logic signal is applied to the three normal input terminals IN1, IN2, and IN3, a scan logic signal is applied to the scan input terminal SCAN_IN, an operating mode signal is applied to the mode input terminal TEST, and a clock signal is applied to the clock input terminal CLK. As shown in FIG. 2, a scan input terminal SCN_IN to which an externally derived scan logic signal is applied, is connected to only the scan input terminal TI of a first scan flip-flip circuit 202. The scan input terminals TI for the other scan flip-flop circuits (204, 206, 208, and 210) are connected in a cascade fashion from the output terminals Q of a previous scan flip-flip circuit to a following scan input terminal of a next scan flip-flop circuit, thereby forming a chain configuration or arrangement. In such a scan chain, signal racing due to clock skew is prevented by inserting nil cells (nil1, nil2, nil3, and nil4) are respectively inserted between an output terminal Q and a corresponding scan input terminal T1 in the cascade.

On the other hand, when the scan chain circuit of FIG. 2 operates in scan mode (TE=1), each of the scan flip-flip circuits performs a scan operation in response to a signal applied through its scan input terminal TI, and outputs a scan test result through scan flip-flop circuit 210 which forms a final stage for the scan chain. In contrast to this operation, when the circuit of FIG. 2 operates in a normal mode (TE=0), each scan flip-flop circuit operates in response to a signal applied through a normal input terminal D, regardless of the signal applied through scan input terminal TI. That is, when the circuit of FIG. 2 operates in normal mode (TE=0), the signal applied through a scan input terminal TI for each scan flip-flop circuit is not used during normal operation of the circuit. However, as indicated at Table 1, when the circuit of FIG. 2 operates in normal mode (TE=0), each scan flip-flop circuit will nonetheless continuously toggle in its state in response to the signal applied to its scan input terminal TI in from the preceding output terminal Q. This useless signal level switching consumes considerable power.

SUMMARY OF THE INVENTION

Embodiments of the invention are directed to a scan flip-flop circuit capable of operating with reduced power consumption by maintaining a set scan output value when the scan flip-flop circuit operates in a normal mode.

Embodiments of the invention also allow for increased integration of respective scan flip-flop circuits and scan chains formed by a sequence of scan flip-flop circuits because the scan flip-flop circuit provided by such embodiments requires a reduced number of transistors over conventional approaches.

Thus, in one embodiment, the invention provides a scan flip-flop circuit comprising; an input stage receiving, selecting between, and outputting either a normal logic signal or a scan logic signal in accordance with an operation mode for the scan flip-flop circuit, a flip-flop receiving either the normal logic signal or the scan logic signal selected by the input stage, and outputting in accordance with a clock signal a first logic signal from a first flip-flop output terminal, and an output stage receiving the first logic signal and comprising first and second output terminals, such that a signal output from the first output terminal is identical to the normal logic signal received in the input stage, and a signal output from the second output terminal maintains a high logic value when the scan flip-flop circuit operates in a normal mode and a signal output from the first and second output terminals are identical to the scan logic signal received in the input stage when the scan flip-flop circuit operates in a scan mode.

In a related aspect, foregoing scan flip-flop circuit receives an operating mode signal in the input stage, and the input stage comprises an OR gate receiving and ORing the normal logic signal and the operating mode signal, and a NAND gate receiving and NANDing the scan logic signal and a logical output from the OR gate, such that the scan logic signal has a high logic value when the scan flip-flop circuit operates in normal mode.

In another related aspect, the output stage of the foregoing scan flip-flop comprises; an inverter receiving, inverting, and outputting the first logic signal, and a NAND gate receiving and NANDing the first logic signal with the operating mode signal, and outputting a corresponding result from the first output terminal.

In yet another related aspect, the foregoing flip-flop comprises a second flip-flop output terminal outputting in accordance with the clock signal a second logic signal being the logical complement of the first logic signal, and the output stage comprises a NAND gate receiving and NANDing the first logic signal and the operating mode signal, and outputting a scan terminal output signal from the first output terminal, and an inverter receiving, inverting, and outputting the second logic signal, and outputting a normal output result at the second output terminal.

In another embodiment, the invention provides a scan chain comprising any one of the foregoing scan flip flops connected in a sequence.

In a related aspect, the scan chain comprises a first one of the plurality of scan flip-flop circuits receiving an externally provided scan logic signal. Thereafter, the scan input terminal for each one of the plurality of scan flip-flop circuits subsequent to the first one is connected to the first output terminal of a previous one of the plurality of scan flip-flop circuits, and the externally provided scan logic signal is maintained at a high logic value when the scan chain operates in a normal operating mode.

BRIEF DESCRIPTION OF THE DRAWINGS

Exemplary embodiments of the invention are described hereafter with reference to the accompanying drawings which constitute a part of this specification. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided as teaching example sufficient to fully convey the scope of the invention to those skilled in the art. Throughout the specification like numerals refer to like elements.

Figure 3:
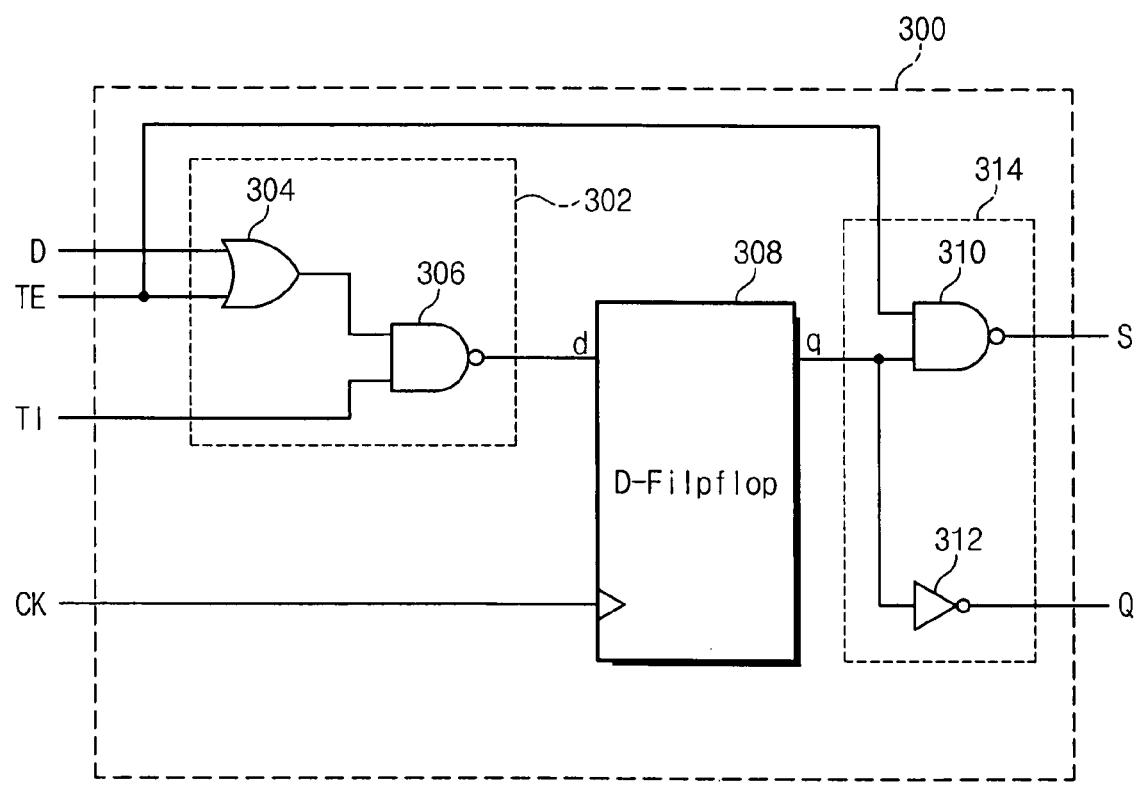
FIG. 3 is a circuit diagram showing a scan flip-flop circuit according to one embodiment of the present invention.

FIG. 3 is circuit diagram showing a scan flip-flop circuit 300 according to an embodiment of the present invention. With reference to FIG. 3, the scan flip-flop circuit 300 comprises an input stage 302, a D flip-flop 308, and an output stage 314. The scan flip-flop circuit 300 has four input terminals D, TI, TE, and CK, and two output terminals Q (a normal output terminal) and S (a scan output terminal). An operating mode signal is applied to the mode input terminal TE, a normal logic signal is applied to the normal input terminal D, a scan logic signal is applied to the scan input terminal TI, and a clock signal is applied to the clock input terminal CK.

Either the normal logic signal or the scan logic signal is output from the normal output terminal Q in response to the clock signal in accordance with a current operating mode for scan flip-flop circuit 300. An output signal is output from the scan output terminal S in responsive to the clock signal and in accordance with the current operating mode of scan flip-flop circuit 300. When scan flip-flop circuit 300 operates in a normal mode (TE=0), the scan output signal always maintains a high logic value of '1'.

In FIG. 3, input stage 302 comprises an OR gate 304 and a NAND gate 306. The OR gate 304 ORs the normal logic signal received through the normal input terminal D and the operating mode signal received through the mode input terminal TE, and outputs the ORed result. The NAND gate 306 NANDs the output of OR gate 304 with the scan logic signal received through the scan input terminal TI, and outputs the NANDed result. Through this series of logic gates, input stage 302 selects and outputs either the normal logic signal or the scan logic signal in accordance with the current operating mode of scan flip-flop circuit 300. That is, when scan flip-flop circuit 300 operates in normal mode (TE=0), input stage 302 selects and outputs the normal logic signal. In contrast, when scan flip-flop circuit 300 operates in scan mode (TE=1), input stage 302 selects and outputs the scan logic signal. In this particular embodiment, when the scan flip-flop circuit 300 operates in normal mode (TE=0), in order to select the normal logic signal, the scan logic signal received through the scan input terminal should have a high logic value of '1'.

The D flip-flop 308 uses only one input terminal "d" and one output terminals "q", although other input and output terminals may be physically present or useable within D flip-flop 308. D flip-flop 308 receives either the normal logic signal or the scan logic signal selected from the output of input stage 302, and outputs the selected signal through output terminals "q" in response to the externally provided clock signal (CLK). The first output terminal "q" outputs the signal received through the input terminal "d."

Output stage 314 comprises a NAND gate 310 and an inverter 312. The NAND gate 310 NANDs the signal output by first output terminal "q" of D flip-flop 308 and an externally provided operating mode signal received through the mode input terminal TE, and outputs the NANDed result. Inverter 312 inverts and outputs the signal output from the first output terminal "q" of flip-flop 308. The NANDed result from NAND gate 310 is output through the scan output terminal "S" of scan flip-flop circuit 300, and the inverted signal from inverter 312 is output through the normal output terminal "Q" of scan flip-flop circuit 300.

Table 2 below is a truth table showing values output from output terminals "Q" and "S" corresponding to signal values received through the respective input terminals D, TI, TE, and CK for the exemplary scan flip-flop circuit 300 shown in FIG. 3. Here, Q(n+1) indicates the output of the circuit during a $(n+1)^{th}$ clock signal, wherein input terminal TI always outputs a high logic value of '1' when scan flip-flop circuit 300 operates in normal mode.

TABLE 2

| D | TI | TE | CK | Q(n + 1) | S(n + 1) |
|---|----|----|----|----------|----------|
| 0 | 1 | 0 | Rising | 0 | 1 |
| 1 | 1 | 0 | Rising | 1 | 1 |
| x | 0 | 1 | Rising | 0 | 0 |
| x | 1 | 1 | Rising | 1 | 1 |
| x | x | x | Falling | Q(n) | S(n) |

As indicated in Table 2, when scan flip-flop circuit 300 operates in normal mode (TE=0), the output from scan output terminal "S" always maintains a high logic state of '1', regardless of the other input signals applied to scan flip-flop circuit 300. This output is made possible by NAND gate 310 in output stage 314 of the exemplary circuit. Further, a logic value for Q(n+1) of signal output through the normal output terminal Q corresponds to an input signal received through normal input terminal D.

However, when scan flip-flop circuit 300 operates in a scan mode (TE=1), logic values for the signal output from the scan output terminal "S" and the normal output terminal "Q" correspond to the signal received through scan input terminal TI.

Figure 4:
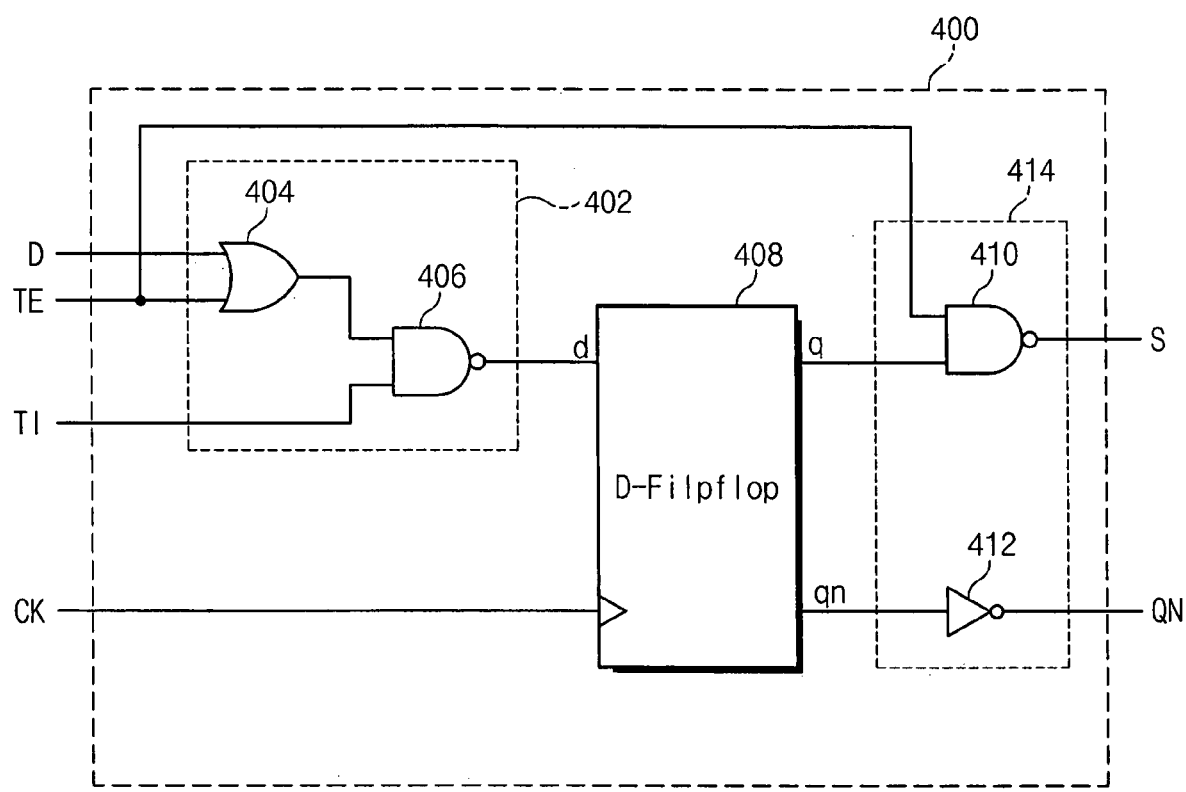
FIG. 4 is circuit diagram showing a scan flip-flop circuit according to another embodiment of the present invention.

FIG. 4 is circuit diagram showing a scan flip-flop circuit 400 according to another embodiment of the present invention. Scan flip-flop circuit 400 of FIG. 4 is adapted to use an inverted version of the signal output from the normal output terminal "Q" in the embodiment of FIG. 3. Hence, normal output terminal "Q" is replaced in the exemplary circuit of FIG. 4 with inverting output terminal "QN." Further, D flip-flop 408 uses first and second output terminals "q" and "qn," respectively.

In this particular embodiment, scan flip-flop circuit 400 inverts a signal output from second output terminal "qn" using an inverter 412. Thus, the signal output from the second output terminal "qn" of D flip-flop 408 is inverted and output from inverting output terminal "QN." Logic values of the signal output from the inverting output terminal "QN" are inverse values of the signal applied to normal input terminal D when scan flip-flop circuit 400 operates in the normal mode (TE=0). Whereas the logic values of the signal output from the inverting output terminal "QN" are inverse values of the signal applied to scan input terminal TI when scan flip-flop circuit 400 operates in the scan mode (TE=1).

Figure 5:
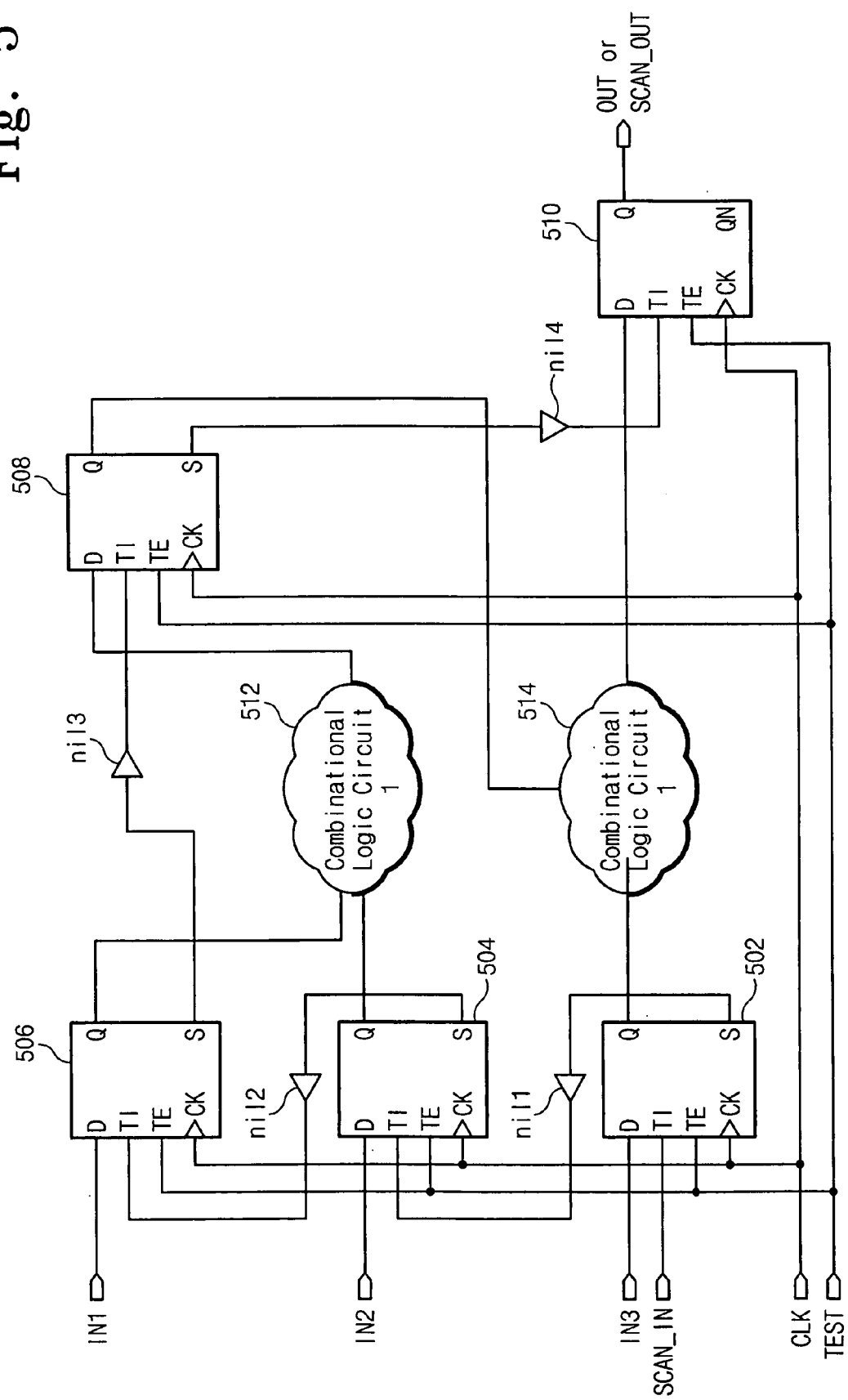
FIG. 5 is a circuit diagram showing an exemplary scan chain incorporating a plurality of scan flip-flop circuits like the one shown in FIG. 3.

FIG. 5 is a circuit diagram conceptually illustrating the operation of a scan chain which uses a scan flip-flop circuit like the one shown in FIG. 3. As shown in FIG. 5, the scan chain comprises five scan flip-flop circuits (502, 504, 506, 508, and 510), and two combinational logic circuits (512 and 514). It is assumed that three scan flip-flop circuits 502, 504, and 506 each receive externally provided normal logic signals when the scan chain operates in normal mode (TE=0).

Referring to FIG. 5, three input terminals IN1, IN2, and IN3 are terminals for receiving respective normal logic signals when the scan chain operates in normal mode (TE=0). A scan chain input terminal SCAN_IN receives an externally provided scan logic signal when the scan chain operates at scan mode (TE=1). On the other hand, when the scan chain operates in normal mode (TE=0), a scan logic signal having a high logic value of '1' is applied to the scan chain input terminal SCAN_IN. The scan chain input terminal SCAN_IN is connected to only the scan input terminal TI of a first scan flip-flop circuit 502.

Figure 1:
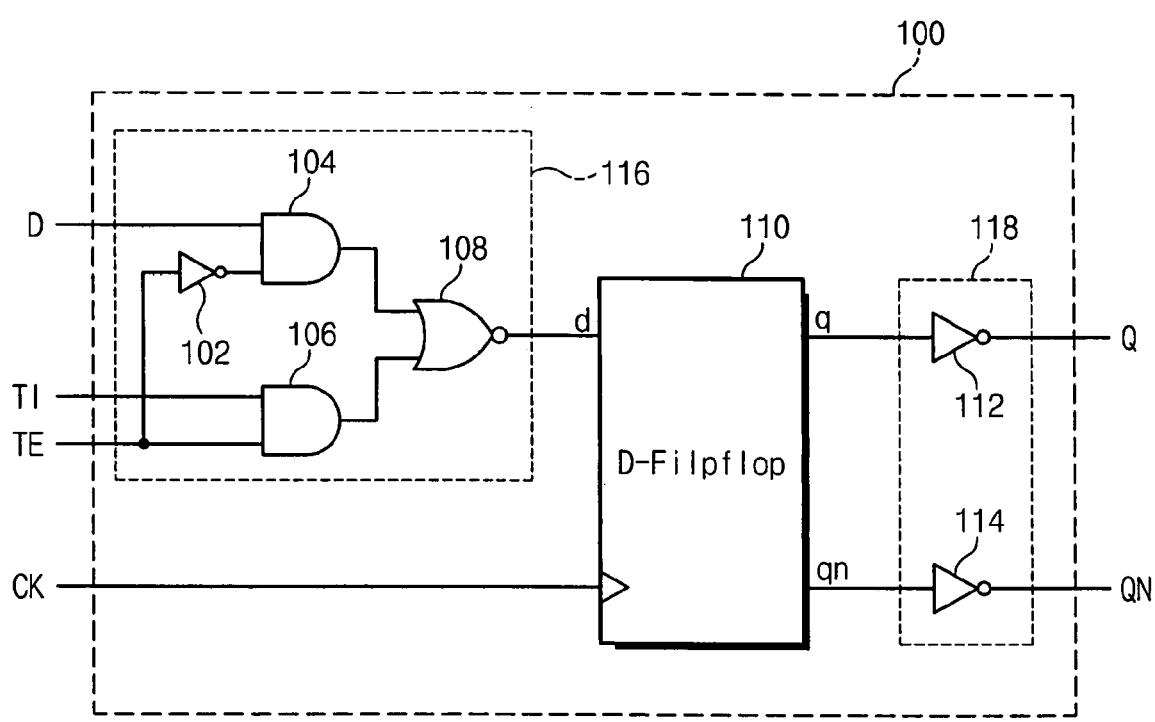
FIG. 1 is a circuit diagram showing a conventional scan flip-flop circuit.
Figure 2:
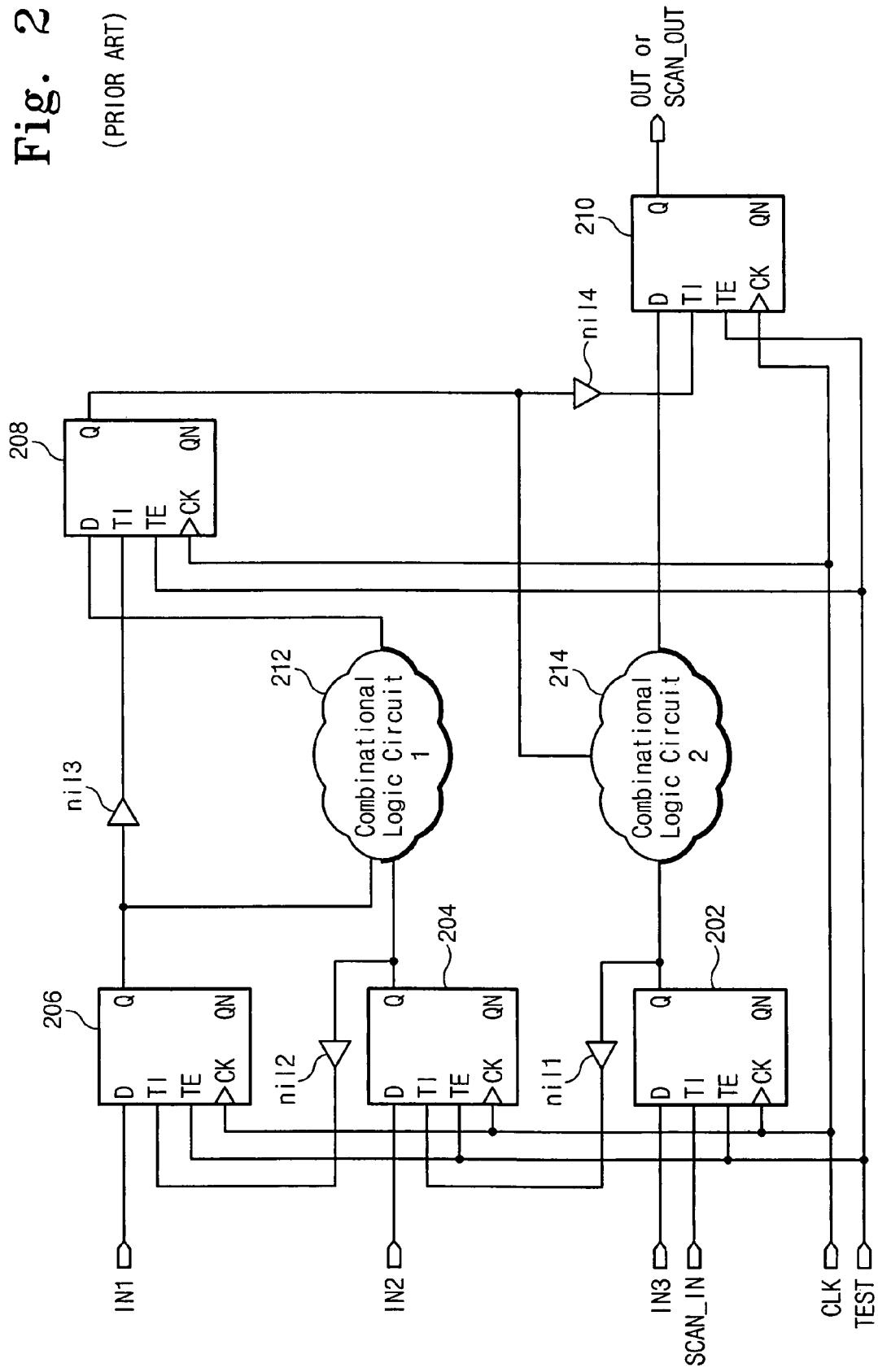
FIG. 2 is a circuit view showing an exemplary scan chain incorporating a plurality of scan flip-flop circuits like the one shown in FIG. 1.

The scan output terminal of the first and subsequent scan flip-flip circuits are connected to the input terminals TI of a next scan flip-flip circuit in the scan chain. As described above, when the scan chain operates in normal mode (TE=0), a scan output signal output from the scan output terminal "S" of each scan flip-flop circuit always maintains a high logic value of '1'. That is, when the scan chain operates in normal mode (TE=0), a scan logic signal for the next scan flip-flop circuit is automatically set to a high logic value of '1'. Accordingly, during normal mode, a scan logic signal having a high logic value of '1' is applied to only the first scan flip-flop circuit 502 in the scan chain. Furthermore, an output terminal "Q" for the last (or output stage) scan flip-flop circuit 510 provides the final state of the scan chain should be used for both a data output and a scan output. Thus, the output stage of scan flip-flop circuit 510 is substituted for the output stage 118 of the conventional scan flip-flop circuit shown in FIG. 1.

As explained above, since the scan flip-flop circuit has an additional scan output terminal "S," and maintains an output for the scan output terminal "S" at a high logic value of '1' during normal operating mode (TE=0), it prevents redundant power consumption within the scan chain. Furthermore, during normal operating mode (TE=0), the scan output terminal "S" has nothing to do with operation of scan flip-flop circuit, and NAND gate 310 of output stage 314 can be implemented in hardware occupying considerably less space on the IC. Accordingly, a delay time for the scan output terminal "S" is increased, thereby reducing the number of inverters or buffers necessarily inserted into the scan chain. Additionally in another embodiment of the invention, since input stage 302 of the constituent scan flip-flop circuit(s) is realized by a combination of an OR gate and a NAND gate, only six transistors are required to implement the input stage. This configuration that allows IC space occupied by the scan flip-flop circuit to be further reduced.

Although the present invention has been described in connection with selected teaching embodiments, it is not limited to only the disclosed circuits and methods of operation. It will be apparent to those skilled in the art that various substitutions, modifications and changes may be thereto without departing from the scope of the invention which is defined by the attached claims.

What is claimed is:

1. A scan flip-flop circuit comprising:
   an input stage receiving, selecting between, and outputting either a normal logic signal or a scan logic signal in accordance with an operation mode for the scan flip-flop circuit;
   a flip-flop receiving either the normal logic signal or the scan logic signal selected by the input stage, and outputting in accordance with a clock signal a first logic signal from a first flip-flop output terminal;
   an output stage receiving the first logic signal and comprising first and second output terminals;
   wherein a signal output from the first output terminal is identical to the normal logic signal received in the input stage, and a signal output from the second output terminal maintains a high logic value when the scan flip-flop circuit operates in a normal mode, and
   wherein a signal output from the first and second output terminals are identical to the scan logic signal received in the input stage when the scan flip-flop circuit operates in a scan mode.

2. The scan flip-flop circuit of claim 1, further receiving an operating mode signal in the input stage, and wherein the input stage comprises:
   an OR gate receiving and ORing the normal logic signal and the operating mode signal; and
   a NAND gate receiving and NANDing the scan logic signal and a logical output from the OR gate;
   wherein the scan logic signal has a high logic value when the scan flip-flop circuit operates in normal mode.

3. The scan flip-flop circuit of claim 2, wherein the output stage comprises:
   an inverter receiving, inverting, and outputting the first logic signal; and
   a NAND gate receiving and NANDing the first logic signal with the operating mode signal, and outputting a corresponding result from the first output terminal.

4. The scan flip-flop circuit of claim 3, wherein the flip-flop is a D flip-flip.

5. The scan flip-flop circuit of claim 1, further receiving an operating mode signal in the input stage;
   wherein the flip-flop further comprises a second flip-flop output terminal outputting in accordance with the clock signal a second logic signal being the logical complement of the first logic signal; and,
   wherein the output stage comprises:
   a NAND gate receiving and NANDing the first logic signal and the operating mode signal, and outputting a scan terminal output signal from the first output terminal; and
   an inverter receiving, inverting, and outputting the second logic signal, and outputting a normal output result at the second output terminal.

6. A scan chain comprising:
   a plurality (first through last) of scan flip-flop circuits;
   wherein each one of the plurality of scan flip-flop circuits comprises:
   a scan input terminal;
   an input stage receiving, selecting between, and outputting either a normal logic signal or a scan logic signal in accordance with an operation mode for the scan flip-flop circuit;
   a flip-flop receiving either the normal logic signal or the scan logic signal selected by the input stage, and outputting in accordance with a clock signal a first logic signal from a first flip-flop output terminal;
   an output stage receiving the first logic signal and comprising first and second output terminals;
   wherein a signal output from the first output terminal is identical to the normal logic signal received in the input stage, and a signal output from the second output terminal maintains a high logic value when the scan flip-flop circuit operates in a normal mode, and
   wherein a signal output from the first and second output terminals are identical to the scan logic signal received in the input stage when the scan flip-flop circuit operates in a scan mode.

7. The scan chain of claim 6, wherein the first one of the plurality of scan flip-flop circuits receives an externally provided scan logic signal.

8. The scan chain of claim 7, wherein the scan input terminal for each one of the plurality of scan flip-flop circuits subsequent to the first one is connected to the first output terminal of a previous one of the plurality of scan flip-flop circuits; and,
   wherein the externally provided scan logic signal is maintained at a high logic value when the scan chain operates in a normal operating mode.

9. The scan chain of claim 8, further comprising an inverter connected between the first output terminal for each one of the plurality of scan flip-flop circuits subsequent to the first one and a corresponding scan input terminal a next one of the plurality of scan flip-flop circuits.

10. The scan chain of claim 9, wherein the input stage of each one of the plurality of scan flip-flop circuits comprises:
an OR gate receiving and ORing the normal logic signal and the operating mode signal; and
a NAND gate receiving and NANDing the scan logic signal and a logical output from the OR gate;
wherein the scan logic signal has a high logic value when the scan flip-flop circuit operates in normal mode.

11. The scan chain of claim 10, wherein the output stage of each one of the plurality of scan flip-flop circuits comprises:
an inverter receiving, inverting, and outputting the first logic signal; and
a NAND gate receiving and NANDing the first logic signal with the operating mode signal, and outputting a corresponding result from the first output terminal.

12. The scan chain of claim 11, wherein the flip-flop in each one of the plurality of scan flip-flop circuits is a D flip-flip.

13. The scan chain of claim 12 wherein the flip-flop further comprises a second flip-flop output terminal outputting in accordance with the clock signal a second logic signal being the logical complement of the first logic signal; and,
wherein the output stage of each one of the plurality of scan flip-flop circuits comprises:
a NAND gate receiving and NANDing the first logic signal and the operating mode signal, and outputting a scan terminal output signal from the first output terminal; and
an inverter receiving, inverting, and outputting the second logic signal, and outputting a normal output result at the second output terminal.

* * * * *